(12) United States Patent
Noda et al.

(10) Patent No.: US 8,940,137 B2
(45) Date of Patent: Jan. 27, 2015

(54) CONTINUOUS PLATING APPARATUS CONFIGURED TO CONTROL THE POWER APPLIED TO INDIVIDUAL WORK PIECES WITHIN A PLATING TANK

(75) Inventors: Tomohiro Noda, Kanuma (JP); Kazutoshi Akamatsu, Nikko (JP)

(73) Assignee: Almex Pe Inc., Taito-Ku, Tokyo (JP)

( * ) Notice: Subject to any disclaimer, the term of this patent is extended or adjusted under 35 U.S.C. 154(b) by 564 days.

(21) Appl. No.: 12/261,127

(22) Filed: Oct. 30, 2008

(65) Prior Publication Data

US 2009/0114530 A1 May 7, 2009

(30) Foreign Application Priority Data

Nov. 1, 2007 (JP) ................................. 2007-284841

(51) Int. Cl.
*C25D 17/06* (2006.01)
*C25D 17/10* (2006.01)
*C25D 21/12* (2006.01)
*C25D 17/28* (2006.01)
*C25D 17/12* (2006.01)
*H05K 3/24* (2006.01)

(52) U.S. Cl.
CPC ............... *C25D 17/06* (2013.01); *C25D 17/12* (2013.01); *C25D 21/12* (2013.01); *H05K 3/241* (2013.01)
USPC ............................ 204/205; 204/202; 204/204

(58) Field of Classification Search
USPC ........................................ 204/202, 204–205
See application file for complete search history.

(56) References Cited

U.S. PATENT DOCUMENTS

| 2,724,690 | A | * | 11/1955 | Solecki | 204/204 |
| 2,724,691 | A | * | 11/1955 | Hakes | 204/204 |
| 2,935,989 | A | * | 5/1960 | Arnold | 134/46 |
| 3,455,809 | A | * | 7/1969 | Geilert | 204/198 |
| 4,065,374 | A | * | 12/1977 | Asami et al. | 204/228.6 |
| 4,118,301 | A | * | 10/1978 | Mayer et al. | 204/202 |
| 4,176,035 | A | * | 11/1979 | Pedone | 204/205 |
| 4,184,927 | A | * | 1/1980 | Takahashi et al. | 205/107 |

(Continued)

FOREIGN PATENT DOCUMENTS

| DE | 3929728 | * | 3/1991 |
| JP | 61-133400 | * | 6/1986 |

(Continued)

*Primary Examiner* — Arlen Soderquist
(74) *Attorney, Agent, or Firm* — David L. Hoffman; Hoffman Patent Group

(57) ABSTRACT

A continuous plating apparatus, when the number of the workpieces simultaneously transferred in the plating tank in a completely immersed state is N, (N+1) cathode relay members that extend in a workpiece transfer direction and (N+1) power supply units being provided outside the plating tank, anode terminals of the power supply units being connected to opposed anodes that are provided in the plating tank, cathode terminals of the power supply units being respectively connected to the cathode relay members so that power is supplied to each of the workpieces transferred in the plating tank from a corresponding power supply unit among the power supply units through a corresponding cathode relay member among the cathode relay members, and each of the power supply units being able to be controlled by constant current control when being transferred in the plating tank in a completely immersed state, by current gradual increase control when being carried into the plating tank in a partially immersed state, and by current gradual decrease control when being carried out from the plating tank in a partially immersed state.

18 Claims, 8 Drawing Sheets

(56) References Cited

U.S. PATENT DOCUMENTS

| | | | |
|---|---|---|---|
| 4,189,360 A * | 2/1980 | Woods et al. | 205/145 |
| 4,263,122 A * | 4/1981 | Urquhart | 204/623 |
| 4,337,134 A * | 6/1982 | Norman | 204/198 |
| 4,378,281 A * | 3/1983 | Scanlon et al. | 204/198 |
| 4,401,522 A * | 8/1983 | Buschow et al. | 205/145 |
| 4,461,690 A * | 7/1984 | Rolff et al. | 204/228.1 |
| 4,534,843 A * | 8/1985 | Johnson et al. | 204/202 |
| 4,775,046 A * | 10/1988 | Gramarossa et al. | 198/803.8 |
| 5,292,424 A * | 3/1994 | Blasing et al. | 205/82 |
| 5,833,816 A * | 11/1998 | Heermann et al. | 204/198 |
| 5,901,997 A * | 5/1999 | Bayer | 294/115 |
| 6,071,387 A * | 6/2000 | Ohba | 204/198 |
| 6,174,418 B1 * | 1/2001 | Ohba | 204/198 |
| 6,217,736 B1 * | 4/2001 | Kopp et al. | 205/137 |
| 6,811,672 B2 * | 11/2004 | Matsuo et al. | 205/238 |
| 2002/0092771 A1 * | 7/2002 | Jones et al. | 205/83 |
| 2002/0189934 A1 * | 12/2002 | Ohba | 204/199 |
| 2003/0003320 A1 * | 1/2003 | Matsuo et al. | 428/647 |
| 2004/0245093 A1 * | 12/2004 | Hubel | 204/198 |
| 2004/0262164 A1 * | 12/2004 | Han et al. | 205/96 |
| 2006/0141157 A1 * | 6/2006 | Sekimoto et al. | 427/282 |
| 2006/0213778 A1 * | 9/2006 | Cheng et al. | 205/105 |

FOREIGN PATENT DOCUMENTS

| | | | |
|---|---|---|---|
| JP | 06-346289 A | | 12/1994 |
| JP | 2000-226697 | | 8/2000 |
| JP | 2001-234400 | * | 8/2001 |
| JP | 2005-76100 | * | 3/2005 |
| JP | 2005-507463 A | | 3/2005 |
| WO | WO 03/038159 A2 | | 5/2003 |

* cited by examiner

| WORKPIECE | SET CURRENT VALUE | LENGTH | $T_{12}(T_{34})$ | TRANSFER SPEED |
|---|---|---|---|---|
| A | Isa | La | Ta | V |
| B | Isb | Lb | Tb | V |
| C | Isc | Lc | Tc | V |
| D | Isd | Ld | Td | V |
| E | Ise | Le | Te | V |
| ⋮ | ⋮ | ⋮ | ⋮ | ⋮ | and by current gradual decrease control when being carried out from the plating tank in a partially immersed state.

CONTINUOUS PLATING APPARATUS CONFIGURED TO CONTROL THE POWER APPLIED TO INDIVIDUAL WORK PIECES WITHIN A PLATING TANK

CROSS REFERENCE TO RELATED APPLICATION

Japanese Application No. 2007-284841, filed on Nov. 1, 2007, is hereby incorporated by reference in its entirety.

BACKGROUND OF THE INVENTION

The present invention relates to a continuous plating apparatus capable of continuously plating each workpiece transferred in a plating tank while supplying power to each workpiece.

In FIG. 9, workpieces 50 (50A to 50E) are thin sheet-shaped articles (e.g., printed circuit board material), and are continuously transferred in a plating tank 10P in a workpiece transfer direction (X) at constant intervals. A workpiece continuous transfer means includes a transfer rail (not shown) that is disposed above a workpiece transfer path and extends in the direction X, a plurality of sliders that are movably secured along the transfer rail (not shown; a portion that serves as a power supply path is indicated by 36P (36PA to 36PE)), a chain conveyer (not shown) that transfers each slider in synchronization, and the like.

Anodes 15PL and 15PR are commonly used for the workpieces (cathodes) 50A to 50E. The anodes 15PL and 15PR are disposed on either side (upper side or lower side in FIG. 9) of the workpiece transfer path, and extend in the direction X. The anodes 15PL and 15PR are connected to an anode terminal 21 of a power supply device 20P through a power supply cable 17P (17PL and 17PR). A cathode terminal 25 of the power supply device 20P is electrically connected to the workpieces 50A to 50E through a power supply cable 37P, the transfer rail, and the sliders (power supply paths 36PA to 36PE).

The power supply device 20P has a capacity sufficient to supply a set current value (e.g., 1 A/dm2) to sides Fr and Fl of each workpiece 50, and is driven by constant current control. The workpieces 50A to 50E can thus be continuously plated while continuously supplying power to the workpieces 50A to 50E transferred in the plating tank 10P. For example, JP-A-2000-226697 discloses a constant current density profile at the middle way in the plating tank (see FIG. 3B).

The electrical resistance and the electrode-electrode distance vary corresponding to each workpiece due to the structure of the electrical path (e.g., cable 17P (17PL and 17R) or power supply path 36P (36PA to 36PE)) or assembly. This causes the following problems. Specifically, a variation in the thickness of the coating or the process quality may occur. The thickness of the coating or the process quality may differ between one side (first side) and the other side (second side) of a single workpiece. The thickness of the coating cannot be caused to differ corresponding to each workpiece. The thickness of the coating cannot be caused to differ corresponding to each side of a single workpiece. When further uniformity in the thickness of the coating and the process quality are desired, the thickness of the coating and the process quality must be made uniform along the workpiece transfer direction (front, center, and rear).

SUMMARY OF THE INVENTION

According to a firs aspect of the invention, there is provided a continuous plating apparatus capable of continuously plating workpieces transferred through a plating tank while continuously supplying power to the workpieces, when the number of the workpieces simultaneously transferred in the plating tank in a completely immersed state is N, (N+1) cathode relay members that extend in a workpiece transfer direction and (N+1) power supply units being provided outside the plating tank, and opposed anodes that extend in the workpiece transfer direction and are commonly used for the workpieces being provided in the plating tank, anode terminals of the power supply units being connected to the anodes and cathode terminals of the power supply units being respectively connected to the cathode relay members so that power is supplied to each of the workpieces transferred in the plating tank from a corresponding power supply unit among the power supply units through a corresponding cathode relay member among the cathode relay members, and each of the power supply units being able to be controlled by constant current control when being transferred in the plating tank in a completely immersed state, by current gradual increase control when being carried into the plating tank in a partially immersed state, and by current gradual decrease control when being carried out from the plating tank in a partially immersed state.

According to a second aspect of the invention, there is provided a continuous plating apparatus capable of continuously plating workpieces transferred through a plating tank while continuously supplying power to the workpieces, when the number of the workpieces simultaneously transferred in the plating tank in a completely immersed state is N, (N+1) cathode relay members that extend in a workpiece transfer direction, (N+1) first-side power supply units, and (N+1) second-side power supply units being provided outside the plating tank, and a first-side anode and a second-side anode that extend in the workpiece transfer direction and are commonly used for the workpieces being oppositely disposed in the plating tank, anode terminals of the first-side power supply units being connected to the first-side anode, anode terminals of the second-side power supply units being connected to the second-side anode, and cathode terminals of the first-side power supply units and cathode terminals of the second-side power supply units being respectively connected to the cathode relay members so that power is supplied to each of the workpieces transferred in the plating tank from a corresponding first-side power supply unit among the first-side power supply units and from a corresponding second-side power supply unit among the second-side power supply units through a corresponding cathode relay member among the cathode relay members, and each of the first-side power supply units and the second-side power supply units being able to be controlled by constant current control when being transferred in the plating tank in a completely immersed state, by current gradual increase control when being carried into the plating tank in a partially immersed state, and by current gradual decrease control when being carried out from the plating tank in a partially immersed state.

BRIEF DESCRIPTION OF THE SEVERAL VIEWS OF THE DRAWING

FIG. 4 shows a table 64M provided in an HDD 64 according to the first embodiment of the invention.

DETAILED DESCRIPTION OF THE EMBODIMENT

Figure 1:
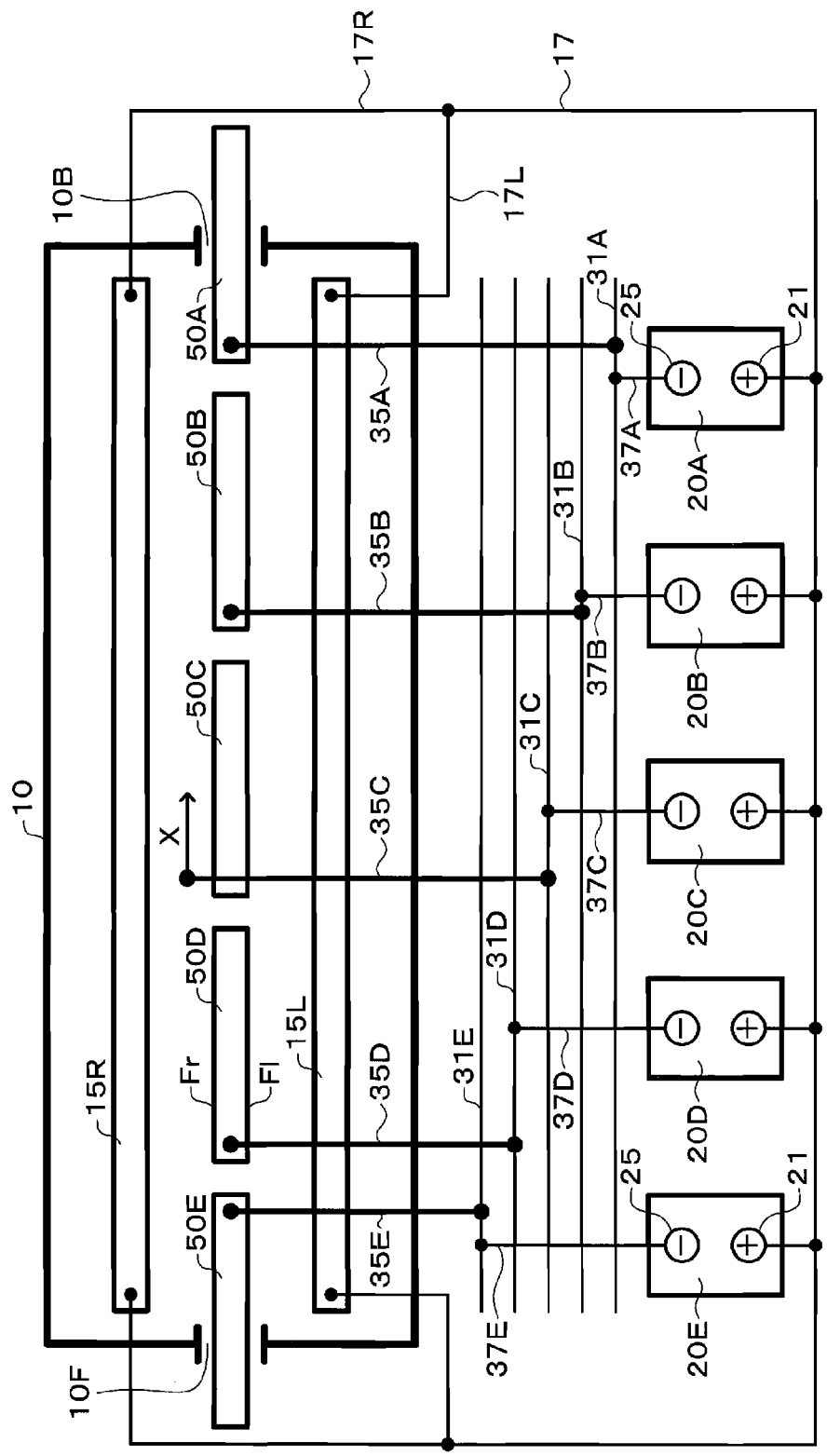
FIG. 1 is a system diagram for describing a first embodiment of the invention.

The invention may provide a continuous plating apparatus capable of plating workpieces while changing a set current value for each workpiece, and particularly a continuous plating apparatus capable of plating workpieces while changing a set current value for each side of each workpiece.

According to one embodiment of the invention, there is provided a continuous plating apparatus capable of continuously plating workpieces transferred through a plating tank while continuously supplying power to the workpieces, when the number of the workpieces simultaneously transferred in the plating tank in a completely immersed state is N, (N+1) cathode relay members that extend in a workpiece transfer direction and (N+1) power supply units being provided outside the plating tank, and opposed anodes that extend in the workpiece transfer direction and are commonly used for the workpieces being provided in the plating tank, anode terminals of the power supply units being connected to the anodes and cathode terminals of the power supply units being respectively connected to the cathode relay members so that power is supplied to each of the workpieces transferred in the plating tank from a corresponding power supply unit among the power supply units through a corresponding cathode relay member among the cathode relay members, and each of the power supply units being able to be controlled by constant current control when being transferred in the plating tank in a completely immersed state, by current gradual increase control when being carried into the plating tank in a partially immersed state, and by current gradual decrease control when being carried out from the plating tank in a partially immersed state.

According to this embodiment, since each workpiece can be continuously plated at a current value set corresponding to each workpiece, a uniform, high-quality plated coating having a uniform thickness corresponding to the set current value can be formed on each workpiece.

According to one embodiment of the invention, there is provided a continuous plating apparatus capable of continuously plating workpieces transferred through a plating tank while continuously supplying power to the workpieces, when the number of the workpieces simultaneously transferred in the plating tank in a completely immersed state is N, (N+1) cathode relay members that extend in a workpiece transfer direction, (N+1) first-side power supply units, and (N+1) second-side power supply units being provided outside the plating tank, and a first-side anode and a second-side anode that extend in the workpiece transfer direction and are commonly used for the workpieces being oppositely disposed in the plating tank, anode terminals of the first-side power supply units being connected to the first-side anode, anode terminals of the second-side power supply units being connected to the second-side anode, and cathode terminals of the first-side power supply units and cathode terminals of the second-side power supply units being respectively connected to the cathode relay members so that power is supplied to each of the workpieces transferred in the plating tank from a corresponding first-side power supply unit among the first-side power supply units and from a corresponding second-side power supply unit among the second-side power supply units through a corresponding cathode relay member among the cathode relay members, and each of the first-side power supply units and the second-side power supply units being able to be controlled by constant current control when being transferred in the plating tank in a completely immersed state, by current gradual increase control when being carried into the plating tank in a partially immersed state, and by current gradual decrease control when being carried out from the plating tank in a partially immersed state.

According to this embodiment, since each workpiece can be continuously plated at a current value set corresponding to each side of each workpiece, a uniform, high-quality plated coating having a uniform thickness corresponding to the set current value can be formed on each side of each workpiece.

Each of the above continuous plating apparatuses may further comprise:

a plurality of workpiece carriers that are secured on a transfer rail that extends in the workpiece transfer direction so that the workpieces can be transferred by the workpiece carriers; and a plurality of arm members, a base of each of the arm members being secured on a corresponding workpiece carrier among the workpiece carriers, and an end of each of the arm members engaging a corresponding cathode relay member among the cathode relay members so as to allow relative movement, wherein each of the arm members is formed to allow direct or indirect current supply; and wherein power can be supplied to each of the workpieces transferred in the plating tank from a corresponding power supply unit among the power supply units through a corresponding cathode relay member among the cathode relay members and a corresponding arm member among the arm members.

This makes it possible to transfer each workpiece and to supply power more stably and smoothly in addition to achieving the above-described effects.

Embodiments of the invention are described below with reference to the drawings.

First Embodiment

As shown in FIGS. 1 to 6B, a continuous plating apparatus can continuously plate each workpiece 50 transferred in a plating tank 10 while supplying power to each workpiece 50. The continuous plating apparatus is formed so that power can be supplied to each workpiece 50 from a power supply unit 20 through a cathode relay member 31 during transfer by constant current control at a set current value (A/dm$^2$) corresponding to each workpiece 50 (first side Fl+second side Fr). The continuous plating apparatus can perform current gradual increase control when introducing the workpiece 50 into the plating tank 10, and can perform current gradual decrease control when discharging the workpiece 50 from the plating tank 10.

In FIG. 1, N (N is an integer equal to or larger than one, e.g., four) workpieces 50 (50A to 50D or 50B to 50E) can be simultaneously transferred in the plating tank 10 in a transfer direction (X) in a completely immersed state. The term "completely immersed state" refers to a state in which the plating target sides (first side Fl+second side Fr) of the workpiece 50 are immersed in a plating solution Q shown in FIG. 2. Therefore, when the workpiece 50A is discharged from an outlet 10B of the plating tank 10 and the workpiece 50E is introduced into an entrance 10F, (N+1) (i.e., five) workpieces 50 (50A to 50E) are immersed in the plating tank 10.

In this case, the workpieces 50B to 50D are in a completely immersed state, and the workpieces 50A and 50E are in a partially immersed state. The term "partially immersed state" refers to a state in which at least of the plating target sides (first side Fl+second side Fr) of the workpiece 50 are partially immersed in the plating solution Q in the longitudinal direction.

When the number of workpieces 50 that can be simultaneously transferred in the plating tank 10 in a completely immersed state is N (e.g., three (five)), the numbers of cathode relay members 31 and power supply units 20 are respectively (N+1) (=four (six)).

As shown in FIG. 1, a pair of anodes 15L and 15R that extend in the direction X are disposed in the plating tank 10 (plating solution Q) so that the anodes 15L and 15R are opposite to each other. The anodes 15L and 15R are commonly used for each workpiece 50 (50A to 50E), and have a length corresponding to the length of the plating tank. The distance (electrode-electrode distance) between each of the anodes 15L and 15R and each workpiece 50 (each of the sides 10*l* and 10*r*) during transfer is maintained at a constant value (predetermined value).

In this embodiment, the anodes 15L and 15R are formed by disposing a plurality of cylindrical anode bags 15LB and 15RB (schematically shown in FIG. 2) that contain a number of soluble anode balls (copper balls) in the direction X. Note that not only the soluble anode balls in this embodiment, but publicly known electrodes may also be used as the anodes 15L and 15R.

Figure 2:
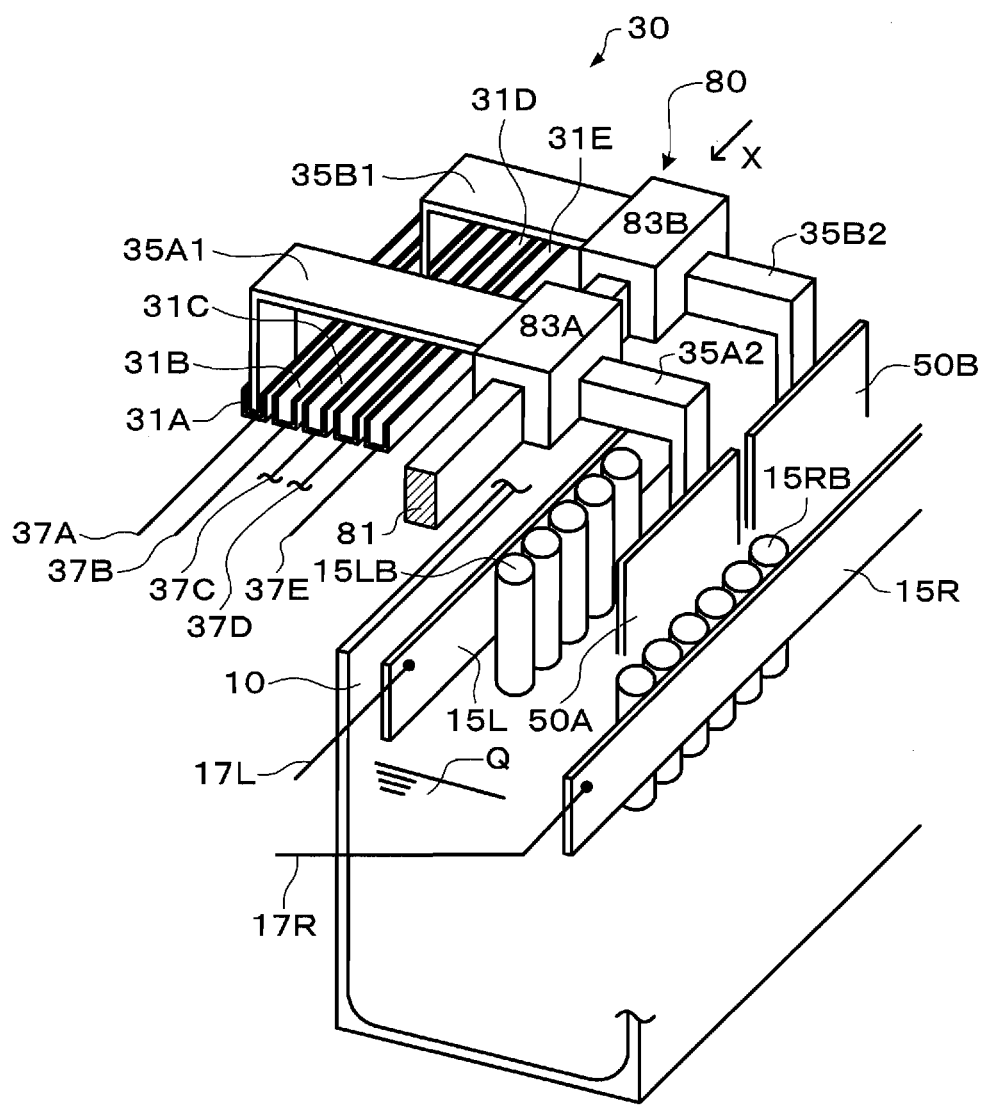
FIG. 2 is a partially cut away perspective view for describing a workpiece continuous transfer means, a continuous power supply means, and the like according to the first embodiment of the invention.

Since the number of workpieces 50 that can be simultaneously transferred in the plating tank 10 in a completely immersed state is N (four), (N+1) (i.e., five) cathode relay members 31 (31A to 31E) that extend in the direction X shown in FIGS. 1 and 2 are disposed outside the plating tank 10. The term "outside the plating tank 10" may be an arbitrary location outside the plating solution Q. In this embodiment, the cathode relay members 31 are disposed in parallel in the direction of the width of the plating tank 10 (see FIG. 2) so that the workpiece 50 can be transferred and power can be supplied to the workpiece 50 more smoothly.

Each of the cathode relay members 31 (31A to 31E) has a copper rail structure having a depressed cross section. Each cathode relay member 31 is formed so that at least the inner surface that comes in contact with (the surface of) a vertical section of an arm member (e.g., 35A1) is formed of an electrical conductor (e.g., copper material).

A workpiece continuous transfer means 80 is a means that continuously transfers each workpiece 50 in the direction X. As shown in FIG. 2, the workpiece continuous transfer means 80 includes a transfer rail 81 that is disposed above the plating tank 10 and extends in the direction X, a plurality of workpiece carriers 83 (83A, 83B, . . . ) that are movably secured along the transfer rail 81, a chain conveyer (not shown) that transfers each workpiece carrier 83 in synchronization, and a plurality of arm members 35 (35A, 35B, . . . ).

The arm member (e.g., 35A) includes a workpiece-holding arm member 35A2 that extends in the rightward direction in FIG. 2, and a current-supply arm member 35A1 that extends in the leftward direction in FIG. 2. The arm member 35 includes a horizontal section which extends in the horizontal direction and of which the base is attached to the workpiece carrier 83, and a vertical section provided on the end of the horizontal section.

The workpiece-holding arm member 35A2 that forms the workpiece continuous transfer means 80 holds the workpiece in a transfer path (i.e., the center of the plating tank in the widthwise direction) through a power supply jig (not shown) provided on the lower end of the vertical section. Therefore, each workpiece can be continuously transferred in the direction X at a set transfer speed V.

A continuous power supply means 30 is a means that supplies plating power to each workpiece 50 (cathode) from each power supply unit 20 (25). In this embodiment, the continuous power supply means 30 is formed by effectively utilizing the elements of the workpiece continuous transfer means 80. Specifically, the continuous power supply means 30 includes the transfer rail 81 shown in FIGS. 1 and 2, the workpiece carrier (e.g., 83A), a power-supply-side current supply path (current-supply arm member 35A1), a workpiece-side current supply path (workpiece-holding arm member 35A2; including the power supply jig), the cathode relay member (31A), a cathode-side cable (37A), an anode-side cable 17 (17L and 17R), and the power supply unit 20. The continuous power supply means 30 can directly supply power to each workpiece 50.

Since the arm member 35 (power-supply-side current supply path (35A1) and workpiece-side current supply path (35A2)) that includes the workpiece-holding arm member 35A2 that extends in the rightward direction in FIG. 2 and the current-supply arm member 35A1 that extends in the leftward direction in FIG. 2 forms the continuous power supply means 30 together with the transfer rail 81, the workpiece carrier 83, and the like, the arm member 35 is formed of an electrical conductor (e.g., copper material). The power-supply-side current supply path and the workpiece-side current supply path may be formed using a bus bar or a power supply cable provided along the corresponding arm member (35A1 or 35A2). In this case, the continuous power supply means 30 indirectly supplies power to each workpiece 50.

An anode terminal 21 of each power supply unit 20 is connected to the anodes 15L and 15R through the cable 17 (17L and 17R). A cathode terminal 25 of each power supply unit 20 (20A to 20E) is connected to the cathode relay member 31 (31A to 31E) through the cable 37 (37A to 37E). This makes it possible to supply power to each workpiece 50 that is continuously transferred in the plating tank 10 from the power supply unit 20 (25) through the cathode relay member 31.

As described above, the workpiece carriers 83 are secured on the transfer rail 81 that extends in the direction X so that workpiece can be transferred, the arm member 35 of which the base is secured on the workpiece carrier 83 and the end engages the corresponding cathode relay member 31 so as to allow relative movement is provided, the arm member 35 is formed to allow direct (or indirect) current supply, and power can be supplied to each workpiece 50 that is continuously transferred in the plating tank 10 from the power supply unit 20 (25) through the cathode relay member 31 and the arm member 35.

As shown in FIG. 1, the power supply units 20 (20A to 20E) are provided in the same number (five) as the number (five) of the cathode relay members 31 (31A to 31E). The power supply capacity is determined depending on the relationship with the workpiece 50 (processing target). Specifically, the current value can be changed corresponding to each workpiece (each power supply unit), and constant current control at a set current value Is can be performed.

Specifically, the power supply unit 20 performs constant current control in a period in which the workpiece 50 is transferred in the plating tank 10 in a completely immersed state, performs current gradual increase control in a period in which the workpiece is introduced into the plating tank in a partially immersed state, and performs current gradual decrease control in a period in which the workpiece is discharged from the plating tank in a partially immersed state.

Figure 6A:
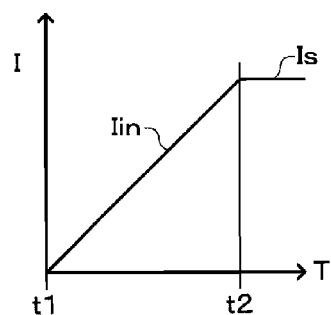
FIGS. 6A and 6B are timing charts for describing a gradual increase/gradual decrease operation according to the first embodiment of the invention.
Figure 6B:
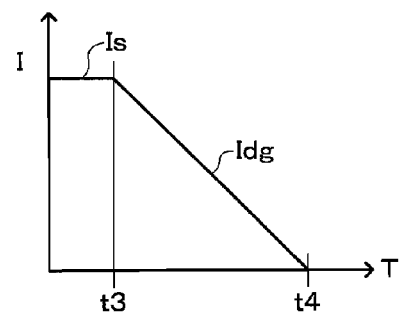

In FIG. 6A (the vertical axis indicates current (I), and the horizontal axis indicates time (T)), a current (Iin) is gradually increased in proportion to the time (plating area) until the set current value Is is reached in a period T12 (=t1 to t2) in which the workpiece is introduced into the plating tank in a partially immersed state. The power supply unit 20 performs constant current control at the set current value Is when the workpiece has been completely immersed (t2). As shown in FIG. 6B, the power supply unit 20 performs current gradual decrease control instead of constant current control at the set current value Is in a period T34 (=t3 to t4) in which the workpiece is discharged from the plating tank in a partially immersed state. The current (Iin) is gradually decreased in inverse proportion to the time (plating area).

Figure 3:
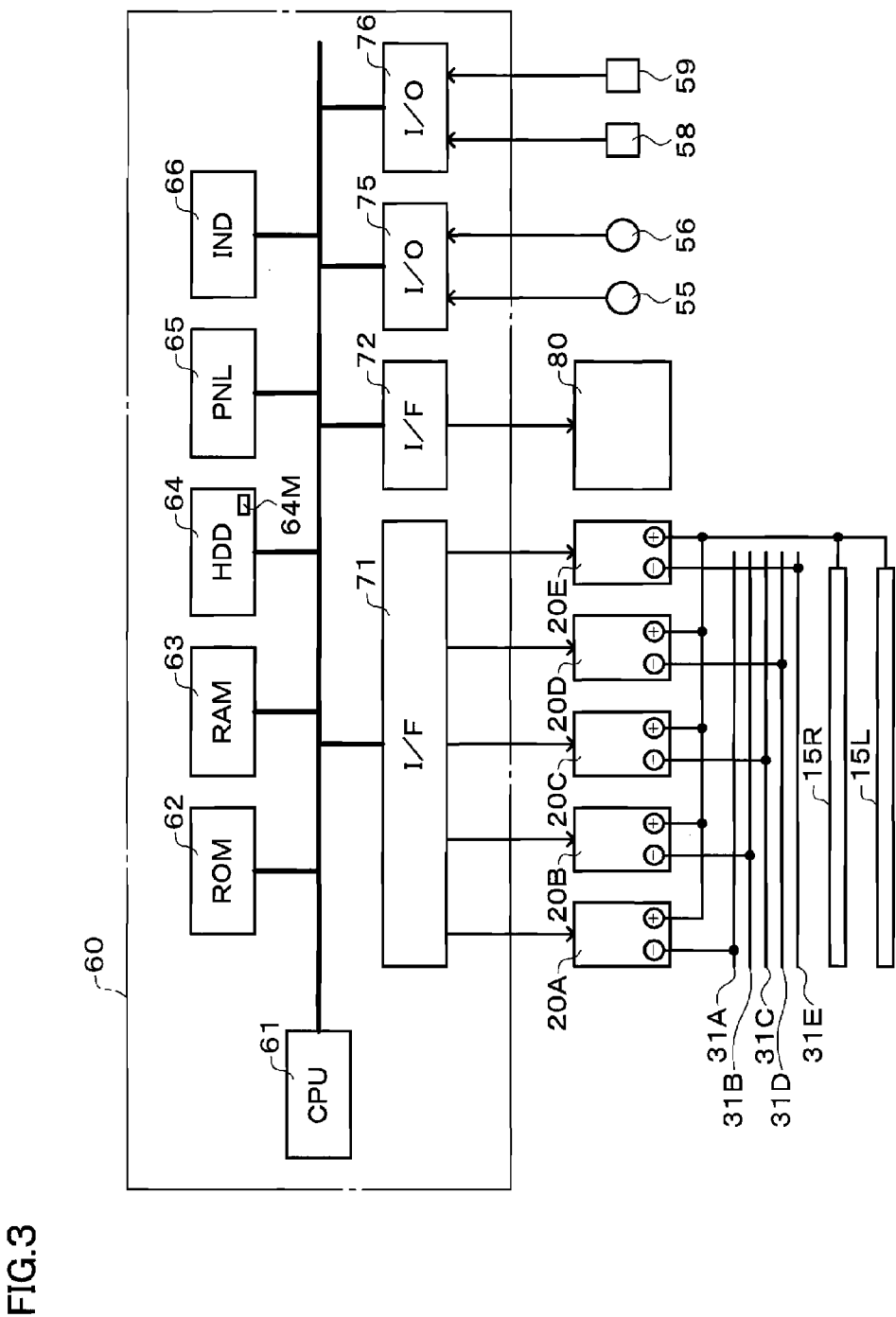
FIG. 3 is a block diagram for describing an operation drive control device according to the first embodiment of the invention.
Figure 5:
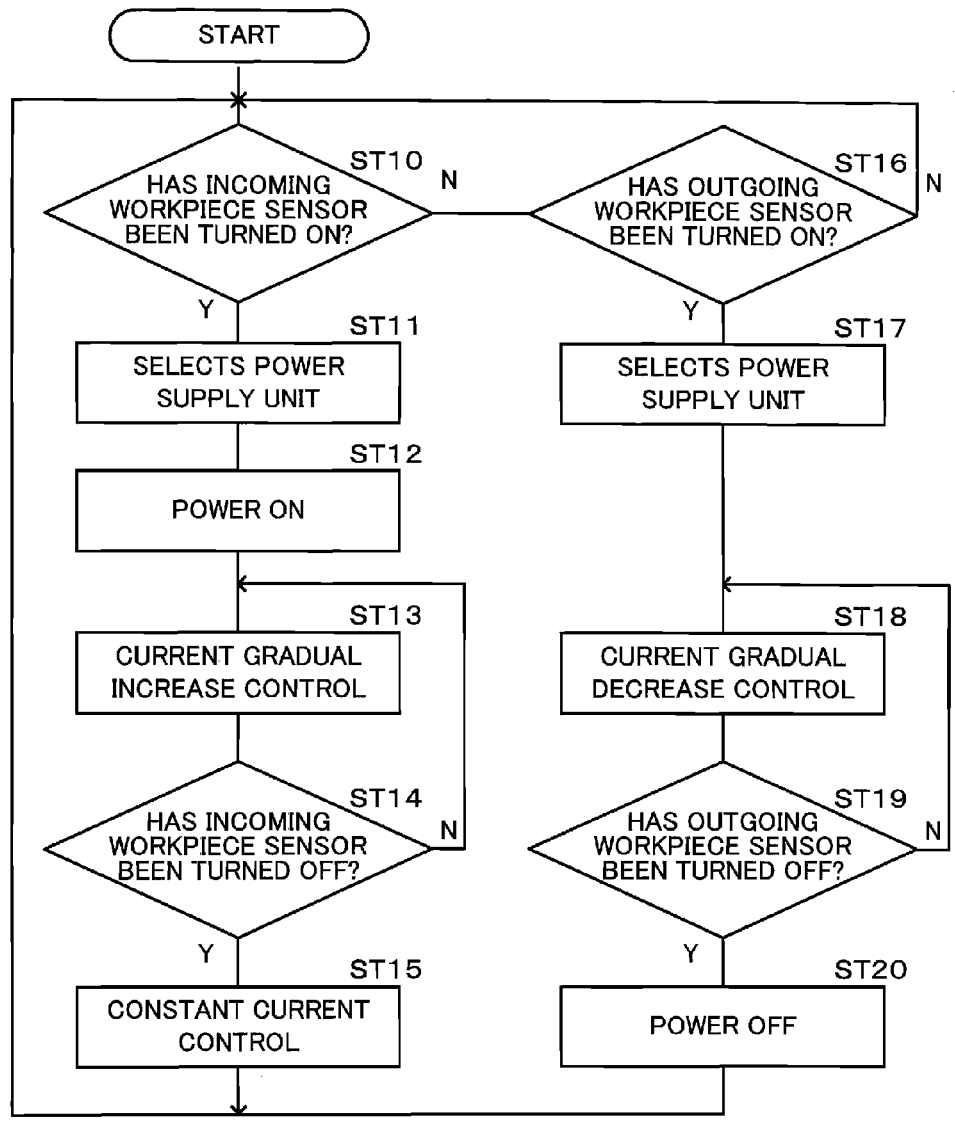
FIG. 5 is a flowchart for describing a transfer/power supply operation according to the first embodiment of the invention.

In FIG. 3, a computer 60 includes a CPU (having a clock function) 61, a ROM 62, a RAM 63, a hard disk (HDD) 64, an operation section (PNL) 65, a display section (IND) 66, a plurality of interfaces (I/F) 71 and 72, and a plurality of input/output ports (I/O) 75 and 76. The computer 60 forms an operation drive control device that has a setting function, a selection function, an instruction function, a drive control function, and the like, and controls the operation of the entire continuous plating apparatus.

As shown in FIG. 4, a table 64M provided in the HDD 64 stores the type (A to E) of the workpiece 50, the dimension (lengths La to Le) of each workpiece in the direction X, and the set current value (Isa to Ise). The table 64M also stores the transfer speed (V) of each workpiece 50 by the workpiece continuous transfer means. The above-mentioned information (A, La, Isa, and V) is input using the operation section 65 while visually checking the input state on the display section 66.

The period T12 in which each workpiece 50 is introduced into the plating tank in a partially immersed state (=period T34 in which each workpiece is discharged from the plating tank in a partially immersed state) is automatically stored as a workpiece period (times Ta to Te) that is calculated by a period calculation means (CPU 61 and ROM 62) using the lengths La to Le and the transfer speed V.

In FIG. 3, the power supply units 20A to 20E are connected to the interface 71, and the workpiece continuous transfer means 80 is connected to the interface 72. An incoming workpiece identification sensor 55 and an outgoing workpiece identification sensor 56 are connected to the input/output port 75. An incoming workpiece sensor 58 and an outgoing workpiece sensor 59 are connected to the input/output port 76.

In this embodiment, the incoming workpiece identification sensor 55 (outgoing workpiece identification sensor 56) is provided on the upstream side of the incoming workpiece sensor 58 (outgoing workpiece sensor 59) in the direction X, and is disposed at a position at which the workpiece 50 (type) can be identified before whether or not the workpiece 50 is introduced (discharged) is detected. The incoming workpiece identification sensor 55 (outgoing workpiece identification sensor 56) identifies the workpiece 50 by reading a mark attached to (e.g., bonded to or written on) the workpiece 50 when the workpiece 50 passes through an identification area. Note that the mark may be attached to a structure (e.g., workpiece carrier 81) corresponding to each workpiece 50.

The incoming workpiece sensor 58 (outgoing workpiece sensor 59) is a photoelectric sensor. The incoming workpiece sensor 58 (outgoing workpiece sensor 59) detects that whether or not the workpiece 50 passes through a partial immersion introduction (discharge) area using a detection light beam. The incoming workpiece sensor 58 (outgoing workpiece sensor 59) is turned ON when the workpiece 50 has entered the partial immersion introduction (discharge) area, remains in an ON state when the workpiece 50 is moved in the partial immersion introduction (discharge) area, and is turned OFF when the workpiece 50 has exited the partial immersion introduction (discharge) area.

A workpiece information readout control means (61 and 62), a power supply automatic ON/OFF control means (61 and 62), a power supply unit selection control means (61 and 62), a workpiece current setting control means (61 and 62), a workpiece current gradual increase control means (61 and 62), a workpiece constant current control instruction means (61 and 62), and a workpiece current gradual decrease control means (61 and 62) are formed by a ROM that stores a control program and a CPU that executes the control program while loading the control program into a RAM.

The workpiece information readout storage control means (61 and 62) reads information corresponding to the workpiece 50 identified by the incoming workpiece identification sensor 55 by searching the table 64M shown in FIG. 4, and stores the information in a work area of the RAM 63. The power supply unit selection control means (61 and 62) selects (ST11) the power supply unit 20 corresponding to the workpiece 50 based on stored information when the workpiece 50 has been introduced into the plating tank 10 (YES in ST10 shown in FIG. 5). The power supply automatic ON/OFF control means (61 and 62) outputs a power-on signal to the selected power supply unit 20 to activate (ST12) the power supply unit 20. When the workpiece 50 is discharged from the plating tank 10 (NO in ST19), the power supply automatic ON/OFF control means (61 and 62) outputs a power-off signal to inactivate (ST20) the power supply unit 20.

The workpiece current setting control means (61 and 62) outputs a current setting signal corresponding to the set current value to each power supply unit 20.

The workpiece current gradual increase control means (61 and 62) generates a gradual increase instruction signal for gradually increasing the current value from zero (0) to the set current value Isa in a period in which the workpiece (e.g., 50A) is introduced into the plating tank in a partially immersed state (=period in which each workpiece is discharged from the plating tank in a partially immersed state=Ta) when the incoming workpiece sensor 58 is turned ON (i.e., the workpiece (50A) has entered a partial immersion introduction area), and outputs the gradual increase instruction signal to the power supply unit 20A. Note that the workpiece current gradual increase control means (61 and 62) may generate the gradual increase instruction signal before the incoming workpiece sensor 58 is turned ON. A gradual increase control signal may be generated and output instead of the gradual increase instruction signal depending on the structure of the power supply unit 20A.

The workpiece current gradual decrease control means (61 and 62) generates a gradual decrease instruction signal for gradually decreasing the current value from the set current value Isa to zero (0) in a period in which the workpiece (50A) is discharged from the plating tank in a partially immersed state (=Ta) when the outgoing workpiece sensor 59 is turned ON (i.e., the workpiece (50A) has entered a partial immersion discharge area), and outputs the gradual decrease instruction signal to the power supply unit 20A. Note that the workpiece current gradual decrease control means (61 and 62) may generate the gradual decrease instruction signal before the outgoing workpiece sensor 59 is turned ON. A gradual decrease control signal may be generated and output instead of the gradual decrease instruction signal depending on the structure of the power supply unit 20A.

The workpiece constant current control instruction means (61 and 62) generates and outputs a constant current control instruction signal to the power supply unit 20 in a period (transfer in a completely immersed state) from the time when the incoming workpiece sensor 58 is turned OFF to the time when the outgoing workpiece sensor 59 is turned ON.

The effects (operation) are described below.

When the workpiece 50A has been transferred in the direction X by the workpiece carrier (83A (35A2)) shown in FIG. 2 and reached a position in front of the entrance 10F shown in FIG. 1, the incoming workpiece identification sensor 55 reads the mark attached to the workpiece 50A. The workpiece information readout storage control means (61 and 62) reads the information (Isa, La, Ta, V) corresponding to the identified workpiece 50A by searching the table 64M shown in FIG. 4, and stores the information in the work area. When the incoming workpiece sensor 58 has been turned ON (YES in ST10 shown in FIG. 5), the power supply unit selection control means (61 and 62) selects (ST11) the power supply unit 20 corresponding to the read mark. The power supply automatic ON/OFF control means (61 and 62) outputs the power-on signal to the selected power supply unit 20 (ST12).

The cathode (50A) and the anodes 15L and 15R are thus electrically connected to the power supply unit 20A. The cathode terminal 25 is connected to the workpiece 50A through the cable 37A, the cathode relay member 31A, and the arm member 35A (power-supply-side current supply path 35A1, workpiece carrier 83A, and workpiece-side current supply path 35A2). The stationary cathode relay member 31A and the movable arm member 35A (power-supply-side current supply path 35A1) are electrically connected during the relative movement (when the workpiece is transferred) in the direction X. The anode terminal 21 is connected to the anodes 15L and 15R through the cable 17 (17L and 17R). Therefore, plating power can be supplied. The workpiece current gradual increase control means (61 and 62) generates the gradual increase instruction signal, and outputs (ST13) the gradual increase instruction signal to the power supply unit 20A. Therefore, the current value Iin supplied to the workpiece 50A is gradually increased from zero (0) to the constant current value Is (see FIG. 6A) in a period (Ta) in which the workpiece is introduced into the plating tank in a partially immersed state. Specifically, since the current value Isa supplied per unit area of each side of the workpiece 50A is constant, the quality can be made uniform.

When the incoming workpiece sensor 58 has been turned OFF (YES in ST14), the workpiece constant current control instruction means (61 and 62) generates and outputs (ST15) the constant current control instruction signal corresponding to the set current value Is a that has been read and stored to the power supply unit 20A. The set current value Isa (A/dm$^2$) is supplied per unit area of the workpiece 50A transferred in a completely immersed state by supplying the constant current value Is to the workpiece 50A. Specifically, constant current control is performed.

The workpiece 50A is continuously transferred in the plating tank 10 (plating solution Q) in the direction X. In this case, a current flows from the anode 15L disposed on the first side Fl to the first side Fl so that a coating is precipitated on the first side Fl, and a current flows from the anode 15R disposed on the second side Fr to the second side Fr so that a coating is precipitated on the second side Fr. The thickness of the plated coating increases in proportion to the plating time.

When the outgoing workpiece sensor 59 has been turned ON (YES in ST16), the power supply unit selection control means (61 and 62) selects (ST17) the power supply unit 20 corresponding to the mark that has been read by the outgoing workpiece identification sensor 56. Since the transfer speed is constant, the workpiece 50A may be identified utilizing the identification result at the entrance 10F. In this case, the outgoing workpiece identification sensor 56 may be omitted.

The workpiece current gradual decrease control means (61 and 62) then generates the gradual decrease command signal, and outputs (ST18) the gradual decrease command signal to the power supply unit 20A. Therefore, the current value Idg supplied to the workpiece 50A is gradually decreased from the constant set current value Is (see FIG. 6B 6A) to zero (0) in a period (Ta) in which the workpiece is discharged from the plating tank in a partially immersed state. Specifically, the current value Isa supplied per unit area of each side of the workpiece 50A is constant at the outlet 10B in the same manner as at the entrance 10F. Therefore, the quality can be made uniform.

When the outgoing workpiece sensor 59 has been turned OFF (YES in ST19), the power supply automatic ON/OFF control means (61 and 62) outputs the power-off signal to the selected power supply unit 20 (ST20). The power supply unit 20A is then turned OFF.

The workpieces 50B, 50C, 50D, and 50E are plated in the same manner as the workpiece 50A. This also applies to subsequent workpieces 50A to 50E. Note that the workpieces are transferred to the cathode relay members 31A to 31E so that two or more workpieces 50 do not simultaneously serve as a load.

According to this embodiment, since each workpiece 50 can be continuously plated at a set current value corresponding to each workpiece 50, a uniform, high-quality plated coating having a uniform thickness corresponding to the set current value can be formed on each workpiece 50.

Since a plurality of workpieces 50 that differ in plating details (e.g., the formation area and the thickness of the coating) can be continuously plated while continuously transferring the workpieces 50, the productivity increases.

Since the power supply device includes the (N+1) power supply units 20, the total power supply capacity and the electrical energy consumption can be reduced as compared with the related-art example.

Since the effects of a variation in the electrical resistance or the electrode-electrode distance due to the structure of the electrical path (e.g., cables 17 and 37 or power supply path (31 and 35)) or assembly can be removed by finely adjusting the set current value corresponding to each workpiece 50, the thickness of the coating and the process quality can be made more uniform.

Since inconvenience when introducing or discharging the workpiece into or from the plating bath 10 can be eliminated by current gradual increase control at the entrance 10f and current gradual decrease control at the outlet 10B, a situation in which the thickness of the coating and the process quality differ along the workpiece 50 (front, center, and rear) in the direction X does not occur.

The arm member (35A (35A2)) of which the base is secured on the workpiece carrier (e.g., 83A) secured on the transfer rail 81 so that the workpiece can be transferred and the end engages the corresponding cathode relay member 31 so as to allow relative movement is provided, the arm member (35A (35A2)) is formed to allow direct (or indirect) current supply, and power can be supplied to each workpiece 50 that is continuously transferred in the plating tank 10 from the power supply unit 20A through the cathode relay member 31A and the arm member (35A (35A1 and 35A2)). Therefore, the workpiece 50 can be transferred and power can be supplied to the workpiece 50 more stably and smoothly.

In the first embodiment, instead of the incoming workpiece identification sensor 55, the outgoing workpiece identification sensor 56, the incoming workpiece sensor 58, and the outgoing workpiece sensor 59, the incoming workpiece identification sensor 55 may be used for example. In this case, the incoming workpiece identification sensor 55 is disposed at the position for the incoming workpiece sensor 58 to identify the workpiece 50 and detect the workpiece 50 entering the partial immersion introduction area. Then the period T12 in which each workpiece is introduced into the plating tank in a partially immersed state, the time when the workpiece is completely immersed (t2), and the period T34 in which each workpiece is discharged from the plating tank in a partially immersed state in FIGS. 6A and 6B are obtained by calculation using the transfer speed V and information about the length of the identified workpiece 50 in the direction X by the period calculation means. By using the result of this calculation, the above-described current gradual increase control and current gradual decrease control can be implemented.

Second Embodiment

Figure 7:
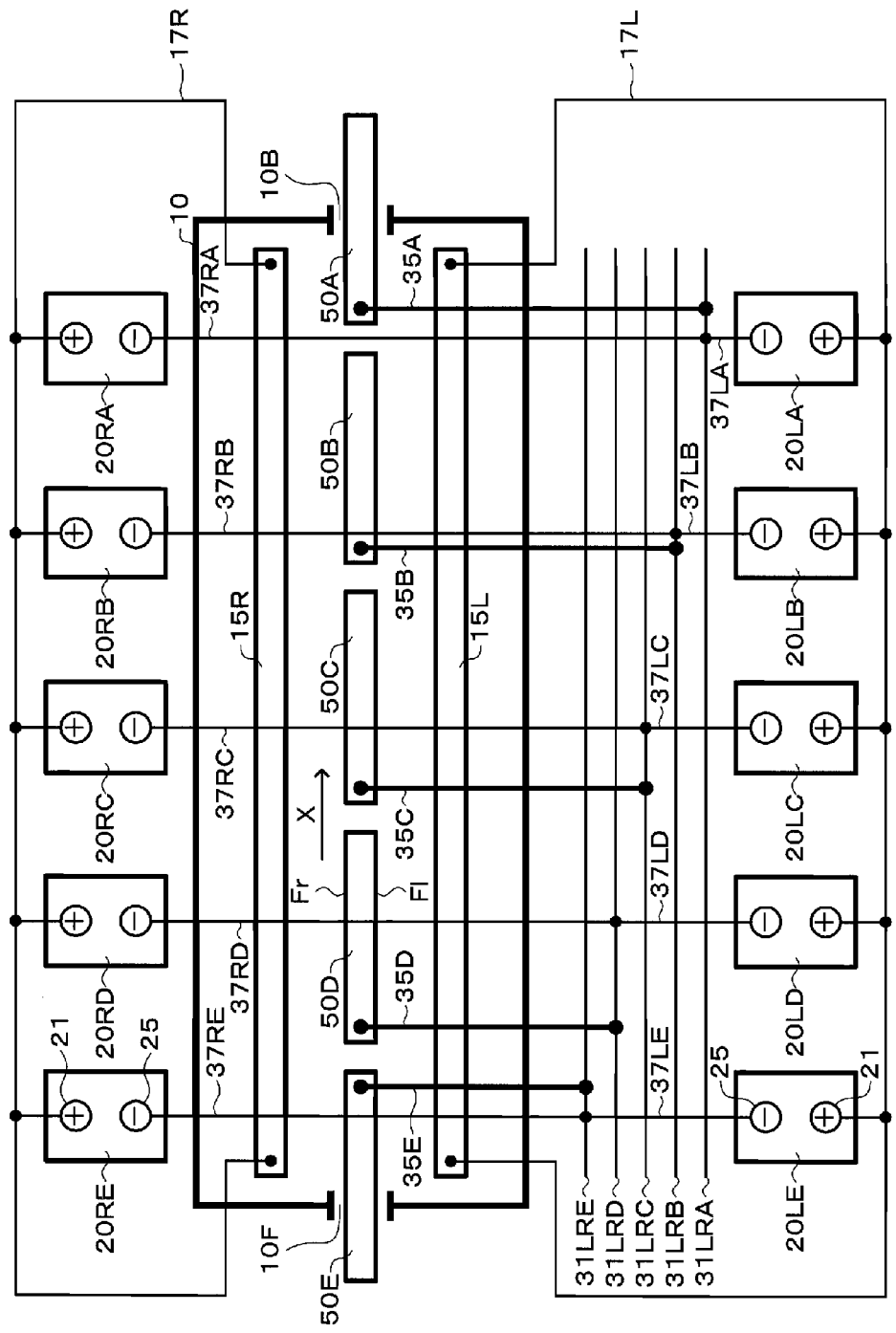
FIG. 7 is a system diagram for describing a second embodiment of the invention.
Figure 8:
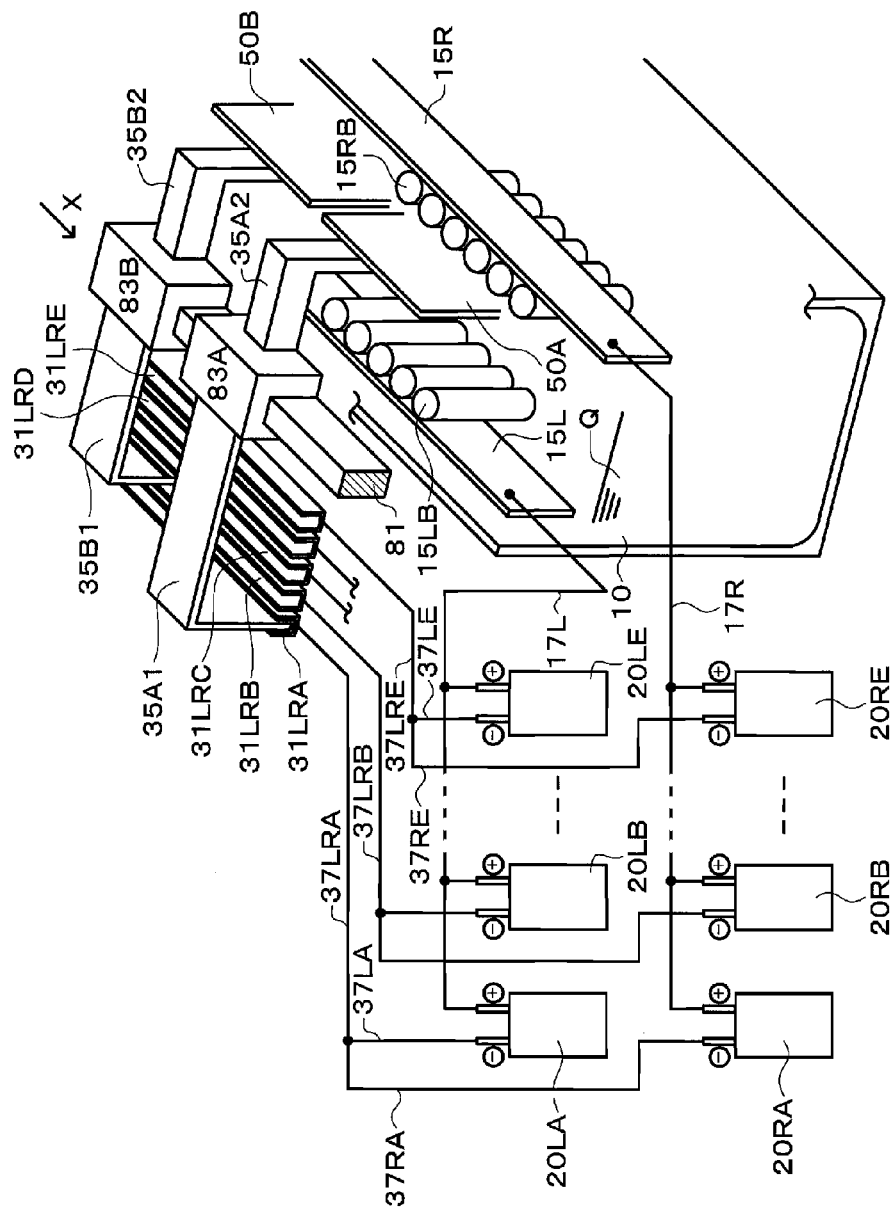
FIG. 8 is a partially cut away perspective view for describing a workpiece continuous transfer means, a continuous power supply means, and the like according to the second embodiment of the invention.
Figure 9:
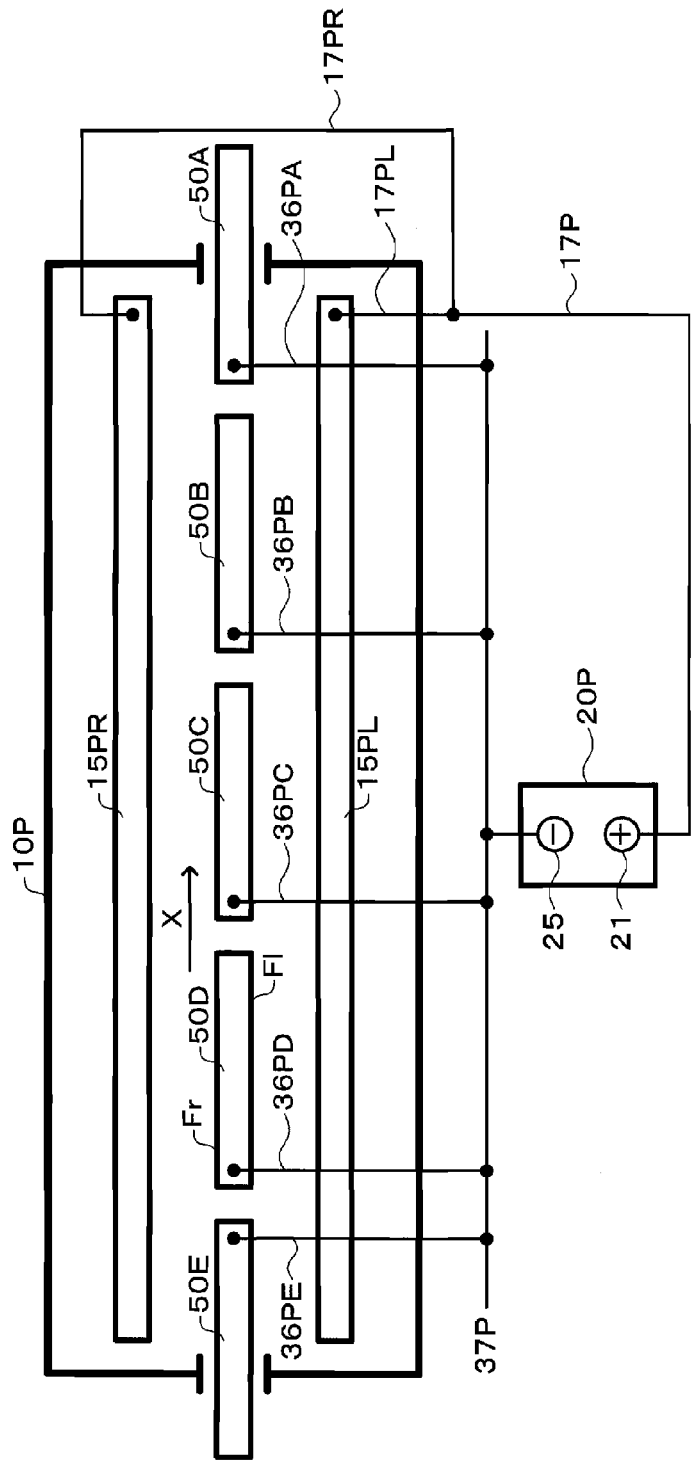
FIG. 9 is a system diagram illustrative of a related-art example.

As shown in FIGS. 7 and 8, a continuous plating apparatus according to second embodiment can continuously plate each workpiece 50 transferred in the plating tank 10 while supplying power to each workpiece 50 in the same manner as in the first embodiment. In the second embodiment, the set current value (A/dm$^2$) can be supplied corresponding to each side (first side Fl+second side Fr) of each workpiece 50.

Specifically, when the number of workpieces 50 that can be simultaneously transferred in the plating tank 10 in a completely immersed state is N (e.g., four), (N+1) (=five) cathode relay members 31 that extend in the direction X and are disposed outside the plating tank 10, (N+1) first-side power supply units 20L, and (N+1) second-side power supply units 20R are provided. A first-side anode 15L and a second-side anode 15R are disposed in the plating tank 10 so that the first-side anode 15L and the second-side anode 15R are opposite to each other, the first-side anode 15L and the second-side anode 15R extending in the direction X and being commonly used for each workpiece 50. The anode terminals 21 of the first-side power supply units 20L are connected to the first-side anode 15L, and the anode terminals 21 of the second-side power supply units 20R are connected to the second-side anode 15R. The cathode terminals 25 of the first-side power supply units 20L and the cathode terminals 25 of the second-side power supply units 20R are connected to the cathode relay members 31. Power can be supplied to each workpiece 50 transferred in the plating tank 10 from the first-side power supply unit 20L and the second-side power supply unit 20R through the cathode relay member 31. Each of the first-side power supply units 20L and the second-side power supply units 20R performs constant current control in a period in which the workpiece 50 is transferred in the plating tank 10 in a completely immersed state, performs current gradual increase control in a period in which the workpiece is introduced into the plating tank in a partially immersed state, and performs current gradual decrease control in a period in which the workpiece is discharged from the plating tank in a partially immersed state.

In FIG. 8, the cathode relay members 31LRA to 31LRE have the structure and the function described in the first embodiment. The cathode relay members 31LRA to 31LRE are commonly used for the first-side power supply unit 20L and the second-side power supply unit 20R. As shown in FIG. 7, the cathode terminals 25 of the first-side power supply units 20L and the second-side power supply units 20R are connected to the cathode relay members 31LRA to 31LRE through the cables 37L (37LA to 37LE) and 37R (37RA to 37RE).

The anode terminals 21 of the first-side power supply units 20L are connected to only the first-side anode 15L through the cable 17L so that power can be supplied to only the first side Fl of the workpiece 50. The anode terminals 21 of the second-side power supply units 20R are connected to only the second-side anode 15R through the cable 17R so that power can be supplied to only the second side Fr of the workpiece 50.

According to this embodiment, since each workpiece 50 can be continuously plated at a set current value corresponding to each of the sides Fl and Fr of each workpiece 50, a uniform, high-quality plated coating having a uniform thickness corresponding to the set current value can be formed on each side of the workpiece 50.

Since a plurality of workpieces 50 that differ in plating details (e.g., the number of coating formation sides, and the area and the thickness of the coating corresponding to each coating formation side) can be continuously plated while continuously transferring the workpieces 50, the productivity increases.

A workpiece 50 for which only one side (Fl or Fr) is plated can be plated. A workpiece 50 for which only one side is plated and a workpiece 50 for which each side is plated can be plated at the same time.

Since the power supply device includes the (N+1) first-side power supply units 20L and the (N+1) second-side power supply units 20R, the total power supply capacity and the electrical energy consumption can be reduced as compared with the related-art example.

The effects of a variation in the electrical resistance or the electrode-electrode distance due to the structure of the electrical path (e.g., cables 17 and 37 or power supply path (31 and 35)) or assembly can be removed by finely adjusting the set current value corresponding to each workpiece 50 and the set current value corresponding to each side of each workpiece 50. Therefore, the thickness of the coating and the process quality can be made more uniform.

Since the cathode relay member (e.g., 31LRA) is commonly used for the first-side power supply unit 20LA and the second-side power supply unit 20RA, the structure is simplified and a power loss can be reduced as compared with the case of separately providing the cathode relay member for the first-side power supply unit 20LA and the cathode relay member for the second-side power supply unit 20RA.

The same effects as those of the first embodiment (e.g., the workpiece 50 can be transferred and power can be supplied to the workpiece 50 more smoothly and stably by supplying power through the cathode relay member 31LRA and the arm member 35A (35A1 and 35A2)) can also be achieved.

The invention is useful for forming a high-quality plated coating having a uniform thickness on a printed circuit board material and the like.

Although only some embodiments of this invention have been described in detail above, those skilled in the art will readily appreciate that many modifications are possible in the embodiments without materially departing from the novel teachings and advantages of this invention. Accordingly, all such modifications are intended to be included within the scope of the invention.

What is claimed is:

1. A continuous plating apparatus capable of continuously plating workpieces transferred through a plating tank while continuously supplying power to the workpieces, the continuous plating apparatus comprising:
   a computer system coupled to the continuous plating apparatus to control operation of the continuous plating apparatus;
   one or more workpieces, a plurality of cathode relay members, and a plurality of power supply units, wherein, when a maximum number of the one or more workpieces simultaneously transferred in the plating tank in a completely immersed state is N, (N+1) cathode relay members that extend in a workpiece transfer direction, wherein each workpiece is electrically connected to one of the cathode relay members, and (N+1) power supply units are provided outside the plating tank;
   a set of opposing anodes that extend in the workpiece transfer direction, the set of the opposing anodes being provided in the plating tank;
   a plurality of anode terminals of the power supply units connected to the set of opposing anodes;
   a plurality of cathode terminals of the power supply units connected to the plurality of cathode relay members;
   a sensor that identifies the workpiece using a workpiece identifying component; and
   a memory that stores a length L of the workpiece being extended in the workpiece transfer direction and corresponding to the workpiece identified by the sensor prior to the identification of the component by the sensor,
   wherein the computer system includes a period calculation portion that calculates a partially immersed period L/V based on the length L being read from the memory a constant transferring speed V of the workpiece,
   wherein power is supplied to each of the one or more workpieces transferred in the plating tank from a corresponding power supply unit among the plurality of power supply units through a corresponding cathode relay member among the plurality of cathode relay members,
   wherein each of the power supply units controls a current to be supplied to the workpiece under constant current control at a constant current Is when being transferred in the plating tank in a completely immersed state, under current gradual increase control to gradually increase up to the constant current Is within a partially immersed period when the workpiece is carried into a first end of the plating tank in a partially immersed state, and under current gradual decrease control to gradually decrease from the constant current Is within a partially immersed period when the workpiece is carried out from a second end of the plating tank in a partially immersed state.

2. The continuous plating apparatus as defined in claim 1, further comprising:
   a plurality of workpiece carriers that are secured on a transfer rail that extends in the workpiece transfer direction so that the one or more workpieces can be transferred by the workpiece carriers; and
   a plurality of arm members, a base of each of the arm members being secured on a corresponding workpiece carrier among the workpiece carriers, and an end of each of the arm members engaging a corresponding cathode relay member among the plurality of cathode relay members so as to allow relative movement,
   wherein each of the arm members is formed to allow at least one of a direct and indirect current supply;
   wherein power can be supplied to each of the one or more workpieces transferred in the plating tank from a corresponding power supply unit among the plurality of power supply units through a corresponding cathode relay member among the plurality of cathode relay members and a corresponding arm member among the arm members.

3. The continuous plating apparatus as defined in claim 1, wherein a current of the current gradual increase control flows through the one or more workpieces being carried into a first end of the plating tank in the partially immersed state and a current of the current gradual decrease control flows through the one or more workpieces being carried out of a second end of the plating tank in the partially immersed state; and
   wherein a current value supplied per unit area of the one or more workpieces is substantially constant while being carried from the first end to the second end of the plating tank.

4. The continuous plating apparatus as defined in claim 3, wherein the current increases linearly from zero at the beginning of the partially immersed period to the constant current Is at the end of the partially immersed period when the workpiece is carried into the plating tank, between the time the workpiece first enters the partially immersed period and time L/V.

5. The continuous plating apparatus as defined in claim 4, wherein the current is linearly decreased from Is at the time where a leading edge of the workpiece is leaving the plating tank.

6. The continuous plating apparatus as defined in claim 3, wherein the current supplied during the gradual increase and gradual decrease in the partially immersion periods increases and decreases at different rates for workpieces of different lengths.

7. A continuous plating apparatus capable of continuously plating workpieces transferred through a plating tank while continuously supplying power to the workpieces, the continuous plating apparatus comprising:
   a computer system coupled to the continuous plating apparatus to control operation of the continuous plating apparatus;
   one or more workpieces, a plurality of cathode relay members, a plurality of first-side power supply units and a plurality of second-side power supply units, wherein, when a maximum number of the one or more workpieces simultaneously transferred in the plating tank in a completely immersed state is N in a workpiece transfer direction, (N+1) cathode relay members that extend in the workpiece transfer direction, wherein each workpiece is electrically connected to one of the cathode relay members, (N+1) first-side power supply units, and (N+1) second-side power supply units are provided outside the plating tank;
   a first-side anode and a second-side anode each extending in the workpiece transfer direction, the first-side anode and the second-side anode being oppositely disposed in the plating tank;

a plurality of anode terminals of the first-side power supply units connected to the first-side anode;

a plurality of anode terminals of the second-side power supply units connected to the second-side anode;

a plurality of cathode terminals of the first-side power supply units and a plurality of cathode terminals of the second-side power supply units connected to the plurality of cathode relay members;

a sensor that identifies the workpiece using a workpiece identifying component; and a memory that stores a length L of the workpiece being extended in the workpiece transfer direction and corresponding to the workpiece identified by the sensor prior to the identification of the component by the sensor, wherein the computer system includes a period calculation portion that calculates a partially immersed period L/V based on the length L being read from the memory a constant transferring speed V of the workpiece, wherein power is supplied to each of the one or more workpieces transferred in the plating tank from a corresponding first-side power supply unit among the first-side power supply units and from a corresponding second-side power supply unit among the second-side power supply units through a corresponding cathode relay member among the plurality of cathode relay members, wherein each of the first-side power supply units and each of the second-side power supply units controls a current to be supplied to the workpiece under constant current control at a constant current Is when being transferred in the plating tank in a completely immersed state, under current gradual increase control to gradually increase up to the constant current Is when the workpiece is carried into a first end of the plating tank in a partially immersed state, and under current gradual decrease control to gradually decrease from the constant current Is when the workpiece is carried out from a second end of the plating tank in a partially immersed state.

8. The continuous plating apparatus as defined in claim 7, further comprising:

a plurality of workpiece carriers that are secured on a transfer rail that extends in the workpiece transfer direction so that the one or more workpieces can be transferred by the workpiece carriers; and a plurality of arm members, a base of each of the arm members being secured on a corresponding workpiece carrier among the workpiece carriers, and an end of each of the arm members engaging a corresponding cathode relay member among the plurality of cathode relay members so as to allow relative movement, wherein each of the arm members is formed to allow at least one of a direct and indirect current supply;

wherein power can be supplied to each of the one or more workpieces transferred in the plating tank from a corresponding power supply unit among the plurality of first-side power supply units and the second-side power supply through a corresponding cathode relay member among the plurality of cathode relay members and a corresponding arm member among the arm members.

9. The continuous plating apparatus as defined in claim 7, wherein a current of the current gradual increase control flows through the one or more workpieces being carried into a first end of the plating tank in the partially immersed state and a current of the current gradual decrease control flows through the one or more workpieces being carried out of a second end of the plating tank in the partially immersed state; and wherein a current value supplied per unit area of the one or more workpieces is constant while being carried from the first end to the second end of the plating tank.

10. A continuous plating apparatus capable of continuously plating workpieces transferred through a plating tank while continuously supplying power to the workpieces, the continuous plating apparatus comprising:

the plating tank;

a computer system coupled to the continuous plating apparatus to control operation of the continuous plating apparatus;

one or more workpieces, a plurality of cathode relay members that extend in a workpiece transfer direction, and a plurality of power supply units that are provided outside the plating tank, wherein each workpiece is electrically connected to one of the cathode relay members;

an anode that extends in the workpiece transfer direction and is provided in the plating tank;

at least one anode terminal of the power supply units being connected to the anodes;

a plurality of cathode terminals of the power supply units connected to the plurality of cathode relay members;

a sensor that identifies the workpiece using a workpiece identifying component;

a memory that stores a length L of the workpiece being extended in the workpiece transfer direction and corresponding to the workpiece identified by the sensor prior to the identification of the component by the sensor, wherein the computer system includes a period calculation portion that calculates a partially immersed period L/V based on the length L being read from the memory a constant transferring speed V of the workpiece, wherein power is supplied to each of the one or more workpieces transferred in the plating tank from a corresponding power supply unit among the plurality of power supply units through a corresponding cathode relay member among the plurality of cathode relay members, wherein each of the power supply units is coupled to and controlled by the computer system and controls a current to be supplied to the workpiece under constant current control at a constant current Is when being transferred in the plating tank in a completely immersed state, under current gradual increase control to gradually increase up to the constant current Is within a partially immersed period when the workpiece is carried into a first end of the plating tank in a partially immersed state, and under current gradual decrease control to gradually decrease from the constant current Is within a partially immersed period when the workpiece is carried out from a second end of the plating tank in a partially immersed state;

a plurality of arm members each configured to carry a workpiece.

11. The continuous plating apparatus as defined in claim 10, wherein a plurality of anode terminals of the power supply units are connected to the anode.

12. The continuous plating apparatus as defined in claim 11, further comprising:

a plurality of workpiece carriers that are secured on a transfer rail that extends in the workpiece transfer direction so that the one or more workpieces can be transferred by the workpiece carriers, wherein a base of each of the arm members is secured on a corresponding workpiece carrier among the workpiece carriers, and an end of each of the arm members engages a corresponding cathode relay member among the plurality of cathode relay members so as to allow relative movement, wherein each of the arm members is formed to allow at least one of a direct and indirect current supply;

wherein power can be supplied to each of the one or more workpieces transferred in the plating tank from a corresponding power supply unit among the plurality of first-side power supply units and the second-side power supply through a corresponding cathode relay member among the plurality of cathode relay members and a corresponding arm member among the arm members.

13. The continuous plating apparatus as defined in claim 11, wherein a current of the current gradual increase control flows through the one or more workpieces being carried into a first end of the plating tank in the partially immersed state and a current of the current gradual decrease control flows through the one or more workpieces being carried out of a second end of the plating tank in the partially immersed state; and wherein a current value supplied per unit area of the one or more workpieces is constant while being carried from the first end to the second end of the plating tank.

14. The continuous plating apparatus as defined in claim 10, further comprising:

a plurality of workpiece carriers that are secured on a transfer rail that extends in the workpiece transfer direction so that the one or more workpieces can be transferred by the workpiece carriers, wherein a base of each of the arm members is secured on a corresponding workpiece carrier among the workpiece carriers, and an end of each of the arm members engages a corresponding cathode relay member among the plurality of cathode relay members so as to allow relative movement, wherein each of the arm members is formed to allow at least one of a direct and indirect current supply;

wherein power can be supplied to each of the one or more workpieces transferred in the plating tank from a corresponding power supply unit among the plurality of power supply units through a corresponding cathode relay member among the plurality of cathode relay members and a corresponding arm member among the arm members.

15. The continuous plating apparatus as defined in claim 10, wherein a current of the current gradual increase control flows through the one or more workpieces being carried into a first end of the plating tank in the partially immersed state and a current of the current gradual decrease control flows through the one or more workpieces being carried out of a second end of the plating tank in the partially immersed state; and wherein a current value supplied per unit area of the one or more workpieces is substantially constant while being carried from the first end to the second end of the plating tank.

16. The continuous plating apparatus as defined in claim 15, wherein the current increases linearly from zero at the beginning of the partially immersed period to the constant current Is at the end of the partially immersed period when the workpiece is carried into the plating tank, between the time the workpiece first enters the partially immersed period and time L/V.

17. The continuous plating apparatus as defined in claim 16, wherein the current is linearly decreased from Is at the time where a leading edge of the workpiece is leaving the plating tank.

18. The continuous plating apparatus as defined in claim 15, wherein the current supplied during the gradual increase and gradual decrease in the partially immersion periods increases and decreases at different rates for workpieces of different lengths.

* * * * *